United States Patent
Zhang et al.

(10) Patent No.: US 10,754,727 B2
(45) Date of Patent: Aug. 25, 2020

(54) METHOD AND APPARATUS FOR STORING DATA AND METHOD AND APPARATUS FOR RECOVERING DATA

(71) Applicant: BEIJING SANKUAI ONLINE TECHNOLOGY CO., LTD, Beijing (CN)

(72) Inventors: Shuai Zhang, Beijing (CN); Xiaohui Chen, Beijing (CN); Yin Yin, Beijing (CN); Kai Li, Beijing (CN)

(73) Assignee: BEIJING SANKUAI ONLINE TECHNOLOGY CO., LTD, Beijing (CN)

( * ) Notice: Subject to any disclaimer, the term of this patent is extended or adjusted under 35 U.S.C. 154(b) by 0 days.

(21) Appl. No.: 16/314,281

(22) PCT Filed: Dec. 30, 2016

(86) PCT No.: PCT/CN2016/113523
§ 371 (c)(1),
(2) Date: Dec. 28, 2018

(87) PCT Pub. No.: WO2018/000788
PCT Pub. Date: Jan. 4, 2018

(65) Prior Publication Data
US 2019/0205212 A1    Jul. 4, 2019

(30) Foreign Application Priority Data
Jun. 29, 2016 (CN) .......................... 2016 1 0500318

(51) Int. Cl.
*G11C 29/00* (2006.01)
*G06F 11/10* (2006.01)
(Continued)

(52) U.S. Cl.
CPC .......... *G06F 11/1076* (2013.01); *G06F 11/10* (2013.01); *H03M 13/1515* (2013.01); *H03M 13/373* (2013.01); *H03M 13/616* (2013.01)

(58) Field of Classification Search
CPC .................................. G06F 11/1076; G06F 11/10; H03M 13/1515; H03M 13/616; H03M 13/373
See application file for complete search history.

(56) References Cited

U.S. PATENT DOCUMENTS

2016/0217030 A1*    7/2016    Shin .................... G06F 11/085

FOREIGN PATENT DOCUMENTS

| CN | 102833040 | 12/2012 |
| CN | 104461781 | 3/2015 |

(Continued)

OTHER PUBLICATIONS

Official Communication issued in International Bureau of WIPO Patent Application No. PCT/CN2016/113523, dated Mar. 29, 2017.
(Continued)

*Primary Examiner* — Samir W Rizk
(74) *Attorney, Agent, or Firm* — Greenblum & Bernstein, P.L.C.

(57) ABSTRACT

The present disclosure provides a method and an apparatus for storing data and a method and an apparatus for recovering data, where the method of recovering data may include: reading partial check data and partial data corresponding to to-be-recovered data from prestored data, where the partial check data is obtained by coding entire data of the to-be-stored data based on a partial generator matrix, the partial generator matrix is obtained by dividing a row of an entire generator matrix and rows of the partial generator matrix which are obtained by dividing include a zero element; and recovering the to-be-recovered data based on the read partial check data and partial data. The examples of the (Continued)

present disclosure can reduce read data volume during data recovery and further reduce I/O consumption substantially.

10 Claims, 4 Drawing Sheets

(51) Int. Cl.
    *H03M 13/15*     (2006.01)
    *H03M 13/00*     (2006.01)
    *H03M 13/37*     (2006.01)

(56) References Cited

FOREIGN PATENT DOCUMENTS

| | | |
|---|---|---|
| CN | 105335150 | 2/2016 |
| CN | 105335252 | 2/2016 |
| CN | 105610879 | 5/2016 |
| CN | 106201764 | 12/2016 |
| WO | 2015/195104 | 12/2015 |

OTHER PUBLICATIONS

Kamath, Govinda M. et al., "Codes With Local Regeneration and Erasure Correction", IEEE Transactions on Information Theory, Aug. 1, 2014.

Miyamae, Takeshi et al., "Erasure Code with Shingled Local Parity Groups for Efficient Recovery from Multiple Disk Failures", Proc. 10th Workshop on Hot Topics in System Dependability, Jan. 1, 2014.

Huang, Cheng, "Pyramid Codes: Flexible Schemes to Trade Space for Access Efficiency in Reliable Data Storage Systems", ACM Transactions on Storage, Association for Computing Machinery, Mar. 1, 2013.

Rawat, Ankit Singh et al., "Locality and Availability in Distributed Storage", Arxiv.org, Cornell University Library, 201 Olin Library Cornell University Ithaca, Feb. 10, 2014.

Official Communication issued in European Patent Appl. No. 16907175.0, dated May 10, 2019.

Official Communication issued in China Patent Appl. No. 201610500318.5, dated Sep. 13, 2018, along with an English translation thereof.

Official Communication issued in China Patent Appl. No. 201610500318.5, dated May 16, 2018, along with an English translation thereof.

Official Communication issued in International Bureau of WIPO Patent Appl. No. PCT/CN2016/113523, dated Mar. 29, 2017.

\* cited by examiner

METHOD AND APPARATUS FOR STORING DATA AND METHOD AND APPARATUS FOR RECOVERING DATA

CROSS REFERENCE TO RELATED APPLICATIONS

This application claims priority to Chinese Patent Application No. 201610500318.5 entitled "METHOD AND APPARATUS FOR STORING DATA AND METHOD AND APPARATUS FOR RECOVERING DATA" filed on Jun. 29, 2016, the entire content of which is incorporated herein by reference.

TECHNICAL FIELD

The present disclosure relates to the field of computer information technology, and particularly to a method and an apparatus for storing data and a method and an apparatus for recovering data.

BACKGROUND

At present, with the rapid development of information technology industry, more and more manufacturers choose to deploy a distributed system in products in consideration of aspects such as costs, reliability and so on. Therefore, the distributed system is developed quickly.

In the architecture of an existing distributed system, a file may be divided into a plurality of data blocks for storage. To ensure robustness and fault recovery capability of the system, a data block generally has a plurality of copies that are respectively stored in different physical positions. However, a fault tolerance method of the above plurality of copies requires more storage devices to be configured, thereby resulting in the increase of costs of storage devices. Taking three copies as an example, the fault tolerance method of the above plurality of copies will increase storage redundancy by 200% and storage cost by 200%.

Compared with the fault tolerance method of a plurality of copies, a Reed-Solomon (RS) method may generate a corresponding check block based on a designated data block and recover an invalid data block based on a valid data block and a check block when the data block is invalid. Thus, higher data reliability can be obtained with smaller data redundancy. For example, when the sizes of a designated data block and its corresponding check block are 100M and 30M respectively, the above RS method may realize storage reliability of three copies by using 30% redundancy.

However, during recovery of invalid data blocks, the above RS method usually needs to read all valid data blocks and check blocks, that is, the above RS method cannot effectively utilize Input/Output (I/O) during data recovery. Usually, the RS method of 30% redundancy needs to read data of 100M during data recovery, which results in ten times I/O consumption.

SUMMARY

To better address one or more of the above concerns, a method of storing data and a method of recovering data are provided.

Further, an apparatus for storing data and an apparatus for recovering data are provided.

In an aspect, the present disclosure discloses a method of storing data, which includes:

obtaining a partial generator matrix corresponding to partial data of to-be-stored data by dividing a row of an entire generator matrix based on the partial data of to-be-stored data, where rows of the partial generator matrix which are obtained by dividing include a zero element;

generating entire check data corresponding to entire data of the to-be-stored data by coding the entire data of the to-be-stored data based on the partial generator matrix, where the entire check data includes partial check data associated with the partial data; and storing the partial check data and partial data corresponding to the partial check data.

Optionally, the partial data of the to-be-stored data is obtained by the following steps:

dividing the to-be-stored data into data blocks:

grouping the data blocks; and obtaining the partial data according to each of the groups.

Optionally, the partial data of the to-be-stored data includes: grouped partial data according to the to-be-stored data the partial check data includes:

first partial check data corresponding to single-grouped partial data; and/or second partial check data corresponding to combined-grouped partial data.

Optionally, the above method further includes:

storing a mapping relationship between single-grouped information and a memory address of the first partial check data and/or storing a mapping relationship between combined-grouped information and a memory address of the second partial check data.

In another aspect, the present disclosure discloses a method of recovering data, which includes:

reading partial check data and partial data corresponding to to-be-recovered data from prestored data, where the partial check data is obtained by coding entire data of the to-be-stored data based on a partial generator matrix, the partial generator matrix is obtained by dividing a row of an entire generator matrix, and rows of the partial generator matrix which are obtained by dividing include a zero element; and recovering the to-be-recovered data based on the read partial check data and partial data.

Optionally, recovering the to-be-recovered data based on the read partial check data and partial data includes:

constructing a partial decoding matrix, where the partial decoding matrix includes: a row of an identity matrix and a row of the partial generator matrix, the row of the identity matrix does not include a row corresponding to the to-be-recovered data and the partial decoding matrix is a square matrix; and obtaining raw data corresponding to the to-be-recovered data by decoding the partial check data and partial data based on . the partial decoding matrix.

Optionally, reading the partial check data corresponding to the to-be-recovered data from the prestored data includes:

obtaining first to-be-recovered data belonging to a single target group from the to-be-recovered data; and when a data length of the first to-be-recovered data is not greater than a data length of first partial check data corresponding to the single target group, reading first partial check data and partial data corresponding to the single target group from the prestored data, as partial check data and partial data corresponding to the first to-be-recovered data, where the first partial check data is obtained based on single-grouped partial data.

Optionally, reading the first partial check data corresponding to the single target group from the prestored data includes:
obtaining a first target memory address of the first partial check data corresponding to the single target group based on a prestored mapping relationship between single-grouped information and a memory address of the first partial check data; and
reading the first partial check data from the prestored data based on the first target memory address.

Optionally, reading the partial check data corresponding to the to-be-recovered data from the prestored data includes:
obtaining first to-be-recovered data belonging to a single target group from the to-be-recovered data;
when a data length of the first to-be-recovered data is greater than a data length of first partial check data corresponding to the single target group, obtaining second to-be-recovered data belonging to a target combined group from the to-be-recovered data, where the target combined group includes the single target group; and
when a data length of the second to-be-recovered data is not greater than a data length of second partial check data corresponding to the target combined group, reading the second partial check data and partial data corresponding to the target combined group from the prestored data, as partial check data and partial data corresponding to the second to-be-recovered data, where the second partial check data is obtained based on combined-grouped partial data.

Optionally, reading the second partial check data corresponding to the target combined group from the prestored data includes:
obtaining a second target memory address of the second partial check data corresponding to the target combined group based on a prestored mapping relationship between combined-grouped information and a memory address of the second partial check data; and
reading the second partial check data from the prestored data based on the second target memory address.

In still another aspect, the present disclosure discloses an apparatus for storing data, which includes: a processor, by reading machine readable instructions corresponding to control logic for storing data stored on a storage medium, the processor is configured to execute:
obtaining a partial generator matrix corresponding to partial data of to-be-stored data by dividing a row of an entire generator matrix based on the partial data of to-be-stored data, where rows of the partial generator matrix which are obtained by dividing include a zero element;
generating entire check data corresponding to entire data of the to-be-stored data by coding the entire data of the to-be-stored data based on the partial generator matrix, where the entire check data includes partial check data associated with the partial data; and
storing the partial check data and partial data corresponding to the partial check data.

Optionally, the machine readable instructions cause the processor to obtain the partial data of the to-be-stored data, where obtaining the partial data of the to-be-stored data includes:
dividing the to-be-stored data into data blocks;
grouping the data blocks; and
obtaining the partial data according to each of the groups.

In still another aspect, the present disclosure discloses an apparatus for recovering data, which includes: a processor, by reading machine readable instructions corresponding to control logic for recovering data stored on a storage medium, the processor is configured to execute:
reading partial check data and partial data corresponding to to-be-recovered data from prestored data, where the partial check data is obtained by coding entire data of the to-be-stored data based on a partial generator matrix, the partial generator matrix is obtained by dividing a row of an entire generator matrix, and rows of the partial generator matrix which are obtained by dividing include a zero element; and
recovering the to-be-recovered data based on the read partial check data and partial data.

Optionally, when recovering the to-be-recovered data based on the read partial check data and partial data, the machine readable instructions cause the processor to:
construct a partial decoding matrix, where the partial decoding matrix includes: a row of an identity matrix and a row of the partial generator matrix, the row of the identity matrix does not include a row corresponding to the to-be-recovered data and the partial decoding matrix is a square matrix; and
obtain raw data corresponding to the to-be-recovered data by decoding the partial check data and partial data based on the partial decoding matrix.

Optionally, when reading the partial check data corresponding to the to-be-recovered data from the prestored data, the machine readable instructions cause the processor to:
obtain first to-be-recovered data belonging to a single target group from the to-be-recovered data; and
when a data length of the first to-be-recovered data is not greater than a data length of first partial check data corresponding to the single target group, read first partial check data and partial data corresponding to the single target group from the prestored data, as partial check data and partial data corresponding to the first to-be-recovered data, where the first partial check data is obtained based on single-grouped partial data.

Optionally, when reading the first partial check data corresponding to the single target group from the prestored data, the machine readable instructions cause the processor to:
obtain a first target memory address of the first partial check data corresponding to the single target group based on a prestored mapping relationship between single-grouped information and a memory address of the first partial check data; and
read the first partial check data from the prestored data based on the first target memory address.

Optionally, when reading the partial check data corresponding to the to-be-recovered data from the prestored data, the machine readable instructions cause the processor to:
obtain first to-be-recovered data belonging to a single target group from the to-be-recovered data; and
when a data length of the first to-be-recovered data is greater than a data length of first partial check data corresponding to the single target group, obtain second to-be-recovered data belonging to a target combined group from the to-be-recovered data, where the target combined group includes the single target group; and
when a data length of the second to-be-recovered data is not greater than a data length of second partial check data corresponding to the target combined group, read the second partial check data and partial data corresponding to the target combined group from the prestored data, as partial check data and partial data corresponding to the second to-be-recovered data, where the second partial check data is obtained based on combined-grouped partial data.

Optionally, when reading the second partial check data corresponding to the target combined group from the prestored data, the machine readable instructions cause the processor to:

obtain a second target memory address of the second partial check data corresponding to the target combined group based on a prestored mapping relationship between combined-grouped information and a memory address of the second partial check data; and read the second partial check data from the prestored data based on the second target memory address.

Compared with the prior art, the present disclosure includes the following advantages.

In examples of the present disclosure, the partial check data is obtained by performing coding based on the partial generator matrix corresponding to the partial data of the to-be-stored data. Since the rows of the above partial generator matrix which are obtained by dividing may include a zero element, it can be guaranteed that the above partial check data is associated with the above partial data and irrelevant to data other than the above partial data in the to-be-stored data. Thus, the corresponding partial data can be recovered based on the above partial check data without relying on other data. That is, in examples of the present disclosure, it is possible to read only the partial check data and partial data corresponding to the to-be-recovered data during data recovery. Therefore, compared with the approach of usually reading all valid data blocks and check blocks during recovery of an invalid data block, I/O consumption during data recovery can be substantially reduced due to reduction of read data volume during data recovery in examples of the present disclosure.

DETAILED DESCRIPTION OF THE EMBODIMENTS

To make the above objects, characteristics and advantages of the present disclosure more apparent and understandable, the present disclosure will be detailed further in combination with the accompanying drawings and detailed description.

Example of a Method of Storage

In the following description, numerous specific details of embodiments of the present disclosure are set forth. However, it is understood that embodiments of the disclosure may be practiced without these specific details. In other instances, well-known circuits, structures and techniques have not been shown in detail in order not to obscure the understanding of this description. Those of ordinary skills in the art, with the included descriptions, will be able to implement appropriate functionality without undue experimentation.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. It shall be understood that the singular forms "a", "an" and "the" include plural referents unless the context explicitly indicates otherwise.

Figure 1:
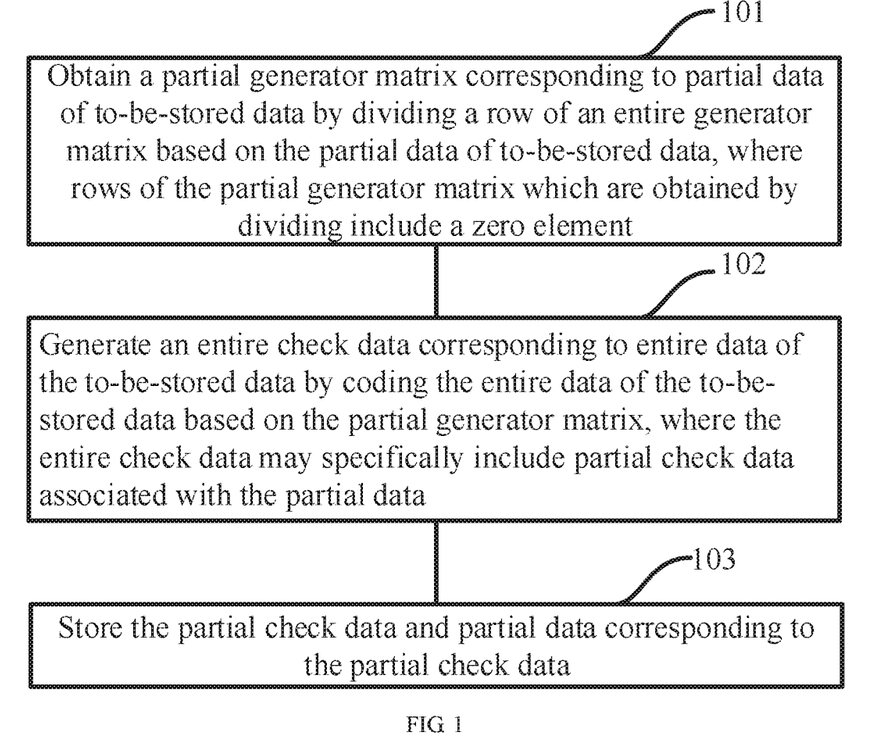
FIG. 1 is a flowchart illustrating steps of an example of a method of storing data according to the present disclosure.

FIG. 1 illustrates steps of the example of a method of storing data according to the present disclosure, which may specifically include the following steps 101-103.

At step 101, a partial generator matrix corresponding to partial data of to-be-stored data is obtained by dividing a row of an entire generator matrix based on the partial data of to-be-stored data, where rows of the partial generator matrix which are obtained by dividing include a zero element.

At step 102, an entire check data corresponding to entire data of the to-be-stored data is generated by coding the entire data of the to-be-stored data based on the partial generator matrix, where the entire check data may specifically include partial check data associated with the partial data.

At step 103, the partial check data and partial data corresponding to the partial check data are stored.

Examples of the present disclosure may be applied to data storage in any field such as a multimedia field, an electronic commerce field, and a search field, that is, the above to-be-stored data may be data of any field. Further, those skilled in the art may determine a data length of the above to-be-stored data as needed. The specific to-be-stored data and its data length are not limited in examples of the present disclosure.

In an example of the present disclosure, the partial data may be a part of entire data of the to-be-stored data. Also, since the partial check data in examples of the present disclosure is obtained by performing coding based on the partial generator matrix corresponding to the partial data and the rows of the above partial generator matrix which are obtained by dividing may include a zero element, it can be guaranteed that the above partial check data is associated with the above partial data and irrelevant to data other than the above partial data in the to-be-stored data. Thus, the partial data can be recovered based on the above corresponding partial check data without relying on other data. That is, in examples of the present disclosure, it is possible to read only the partial check data and partial data corresponding to the to-be-recovered data during data recovery. Therefore, compared with the prior arts of usually reading all valid data blocks and check blocks during recovery of an invalid data block, I/O consumption during data recovery can be substantially reduced due to reduction of read data volume during data recovery in examples of the present disclosure.

In an alternative example of the present disclosure, the partial data of the to-be-stored data may be obtained based on the following steps: dividing the to-be-stored data into data blocks; grouping the data blocks; and obtaining the corresponding partial data according to each of the groups. That is, the partial data in examples of the present disclosure may include: at least one data block corresponding to a group. Further, the partial check data in examples of the present disclosure may also include at least one check block corresponding to the group. For example, in a case that the data length of the data blocks to-be-stored is 100M, the above 100M data blocks may be grouped in the example of the present disclosure. It is assumed that the data length of a first group and a second group is 50M, respectively. A first check block corresponding to the first group may be generated, and a second check block corresponding to the second group may be generated in an example of the present disclosure. In this case, when a data block of the first group is invalid, a corresponding recovery may be performed by reading the valid data blocks in the first group and the first check block in an example of the present disclosure. That is, in the example of the present disclosure, invalid data can be recovered by reading the 50M data blocks. Thus, compared with an existing solution of reading the 100M data blocks, the I/O consumption may be reduced by 50%. Similarly, when a data block of the second group is invalid, a corresponding recovery may be performed by reading the valid data blocks in the second group and the second check block, thereby reducing I/O consumption by 50%.

In an alternative example of the present disclosure, the partial data of the to-be-stored data may be coded to obtain a corresponding partial check vector. The data corresponding to the partial check vector may be the partial check data corresponding to the partial data. Thus, it can be guaranteed that the obtained partial check vector is associated with the above partial data, and is irrelevant to data other than the above partial data in the to-be-stored data. Thus, corresponding partial data can be recovered based on the above partial check vector without relying on other data.

In an application example of the present disclosure, the to-be-stored data may be firstly divided in bytes to obtain a plurality of data blocks and a data vector formed by the plurality of data blocks. Then, the above data vector may be divided into a plurality of data sub-vectors, and the above data sub-vectors may be used as the partial data of the to-be-stored data. Finally, the above data sub-vectors may be coded to obtain corresponding partial check vectors. The data length of the above data blocks may be 1 byte, 2 bytes, 4 bytes or 8 bytes and so on. The specific data length of the above data blocks is not limited in examples of the present disclosure.

In an example, if the entire data (i.e. the data vector) of the above to-be-stored data includes k data blocks and the above partial data (i.e. the data sub-vectors) includes $k_1$ data blocks, $m_1$ check blocks may be generated by coding $k_1$ data blocks.

An example of coding $k_1$ data blocks by a (n, k) RS method is provided herein, where the n is total number of the data blocks to be coded and the check blocks, $k=k_1$ is the number of data blocks to be coded, $m_1=n-k_1$ is the number of check blocks. If $k_1$ data blocks are represented respectively as $D_0, D_1, \ldots D_{k1-1}$, and each data block is $M/k_1$ in size, a product of the entire generator matrix and $k_1$ data blocks may be calculated to obtain $m_1$ check blocks: $C_0, C_1, \ldots C_{m-1}$ and each check block is also $M/K_1$ in size. The above entire generator matrix may be a Galois Field matrix with $m_1$ rows and $k_1$ columns, and the Galois Field matrix may be a transformed Vandermonde matrix or a transformed Cauchy matrix. In the above (n, $k_1$) RS method, when one data block or one check block is invalid, the data block or the check block should be recovered to ensure reliability. Specifically, if the check block is invalid, the invalid check block may be obtained by re-coding the $k_1$ data blocks; if a data block is invalid, the data block may be recovered by using any k blocks of the remaining (n–1) data blocks and check blocks. The above Galois Field may be an expansion of a polynomial field based on a (0, 1) ring on $x^8+x^4+x^3+x^1+1$ and the Galois Field includes 256 elements in total from 0 to 255 which may correspond to all values of one byte.

It may be understood that the process of coding the partial data of the to-be-stored data is only an illustrative example. In fact, those skilled in the art may adopt a desired coding process as needed. The specific process coding the partial data of the to-be-stored data is not limited in examples of the present disclosure.

Similarly, by taking the above (n, k) RS method as an example, m check blocks $C_0, C_1, \ldots$ and $C_{m-1}$ may be obtained by calculating the product of the entire generator matrix and k data blocks in above steps 101 and 102, that is, the above m check blocks may correspond to elements in the entire check vector. In this way, in a case that the above entire check vector include elements associated with the partial data, the above elements are associated with the above partial data and irrelevant to data other than the above partial data in the to-be-stored data. Thus, corresponding partial data can be recovered based on the above partial check vector without relying on other data.

In an application example of the present disclosure, it is assumed that the entire generator matrix obtained by the Galois Field is P, and the P is a matrix with m rows and k columns:

$$P = \begin{bmatrix} 1 & 1 & 1 & 1 & \ldots \\ 1 & 2 & 4 & 8 & \ldots \\ 1 & 3 & 9 & 27 & \ldots \\ \ldots & & & & \end{bmatrix}. \quad (1)$$

A partial generator matrix $Q_1$ is obtained by dividing the first row of the entire generator matrix P into R rows at step 101, where $Q_1$ may be a matrix with (m+R–1) rows and k columns.

It is assumed that m=5, k=4 and R=2, the above partial generator matrix $Q_1$ may be expressed as:

$$Q_1 = \begin{bmatrix} 1 & 1 & 0 & 0 \\ 0 & 0 & 1 & 1 \\ 1 & 2 & 4 & 8 \\ 1 & 3 & 9 & 27 \\ 1 & 4 & 16 & 64 \\ 1 & 5 & 25 & 125 \end{bmatrix}. \quad (2)$$

It can be seen that each of the first row and the second row in the rows of the partial generator matrix $Q_1$ which are obtained by dividing includes zero elements.

In an alternative example of the present disclosure, an entire check vector Cr1 is obtained by multiplying the above partial generator matrix $Q_1$ and the data vector formed by k data blocks at step 102:

$$\begin{bmatrix} 1 & 1 & 0 & 0 \\ 0 & 0 & 1 & 1 \\ 1 & 2 & 4 & 8 \\ 1 & 3 & 9 & 27 \\ 1 & 4 & 16 & 64 \\ 1 & 5 & 25 & 125 \end{bmatrix} * \begin{bmatrix} D_0 \\ D_1 \\ D_2 \\ D_3 \end{bmatrix} = \begin{bmatrix} D_0 + D_1 \\ D_2 + D_3 \\ D_0 + 2D_1 + 4D_2 + 8D_3 \\ D_0 + 3D_1 + 9D_2 + 27D_3 \\ D_0 + 4D_1 + 16D_2 + 64D_3 \\ D_0 + 5D_1 + 25D_2 + 125D_3 \end{bmatrix} = \begin{bmatrix} C_0 \\ C_1 \\ C_2 \\ C_3 \\ C_4 \\ C_5 \end{bmatrix}. \quad (3)$$

It can be seen that the check block $C_0$ in the above entire check vector Cr1 is associated with the partial data $D_0$ and $D_1$, and the check block $C_1$ in the above entire check vector Cr1 is associated with the partial data $D_2$ and $D_3$. Thus, the data recovery can be implemented based on the partial data and partial elements in the entire check vector. For example, a third one can be recovered with any two of the partial data $D_0$ and $D_1$ and the check block $C_0$. For example, when the partial data $D_0$ is invalid, the partial data $D_0$ may be recovered based on the partial data $D_1$ and the check block $C_0$.

In another example of the present disclosure, the first row of the entire generator matrix P may also be divided into rows greater than 2. For example, a partial generator matrix $Q_2$ may be obtained by dividing the first row of the entire generator matrix P into three rows:

$$Q_2 = \begin{bmatrix} 1 & 0 & 0 & 0 \\ 0 & 1 & 0 & 0 \\ 0 & 0 & 1 & 1 \\ 1 & 2 & 4 & 8 \\ 1 & 3 & 9 & 27 \\ 1 & 4 & 16 & 64 \\ 1 & 5 & 25 & 125 \end{bmatrix}. \quad (4)$$

An entire check vector Cr2 may be obtained by multiplying the above partial generator matrix $Q_2$ and the data vector formed by k data blocks:

$$Cr2 = \begin{bmatrix} C_0 \\ C_1 \\ C_2 \\ C_3 \\ C_4 \\ C_5 \\ C_6 \end{bmatrix} = \begin{bmatrix} D_0 \\ D_1 \\ D_2 + D_3 \\ D_0 + 2D_1 + 4D_2 + 8D_3 \\ D_0 + 3D_1 + 9D_2 + 27D_3 \\ D_0 + 4D_1 + 16D_2 + 64D_3 \\ D_0 + 5D_1 + 25D_2 + 125D_3 \end{bmatrix}. \quad (5)$$

It can be seen that the check block $C_0$ in the above entire check vector Cr2 is associated with the partial data $D_0$, the check block $C_1$ is associated with the partial data $D_1$ and the check block $C_2$ in the above entire check vector Cr2 is associated with the partial data $D_2$ and $D_3$. Thus, data recovery may be implemented based on the partial data and partial elements of the entire check vector. For example, the partial data $D_0$ may be recovered directly based on the check block $C_0$, the partial data $D_1$ may be recovered directly based on the check block $C_1$, and a third one may be recovered directly based on any two of the check block $C_2$ and the partial data $D_2$ and $D_3$.

In other examples of the present disclosure, other rows of the entire generator matrix P may also be divided. An example of obtaining a partial generator matrix $Q_3$ by simultaneously dividing the first row and the second row of the entire generator matrix P into two rows is provided herein:

$$Q_3 = \begin{bmatrix} 1 & 1 & 0 & 0 \\ 0 & 0 & 1 & 1 \\ 1 & 2 & 0 & 0 \\ 0 & 0 & 4 & 8 \\ 1 & 3 & 9 & 27 \\ 1 & 4 & 16 & 64 \\ 1 & 5 & 25 & 125 \end{bmatrix}. \quad (6)$$

Then, an entire check vector Cr3 may be obtained by multiplying the above partial generator matrix $Q_3$ and the data vector formed by the k data blocks:

$$Cr3 = \begin{bmatrix} C_0 \\ C_1 \\ C_2 \\ C_3 \\ C_4 \\ C_5 \\ C_6 \end{bmatrix} = \begin{bmatrix} D_0 + D_1 \\ D_2 + D_3 \\ D_0 + 2D_1 \\ 4D_2 + 8D_3 \\ D_0 + 3D_1 + 9D_2 + 27D_3 \\ D_0 + 4D_1 + 16D_2 + 64D_3 \\ D_0 + 5D_1 + 25D_2 + 125D_3 \end{bmatrix}. \quad (7)$$

It can be seen that the check block $C_0$ in the above entire check vector Cr3 is associated with the partial data $D_0$ and $D_1$, the check block $C_2$ in the above entire check vector Cr3 is associated with the partial data $D_0$ and $D_1$, the check block $C_1$ in the above entire check vector Cr3 is associated with the partial data $D_2$ and $D_3$, and the check block $C_3$ in the above entire check vector Cr3 is associated with the partial data $D_2$ and $D_3$. Thus, the data recovery may be implemented based on the partial data and partial elements in the entire check vector. For example, another two may be recovered based on any two of the partial data $D_0$ and $D_1$ and the check blocks $C_0$ and $C_1$. For example, when the partial data $D_0$ and $D_1$ are invalid, the partial data $D_0$ and $D_1$ can be recovered based on the check blocks $C_0$ and $C_2$.

It may be understood that the above process of dividing the rows of the entire generator matrix is used only as an alternative example. In fact, those skilled in the art may perform dividing flexibly on the rows of the entire generator matrix as needed. For example, four data blocks of the partial data $D_0$, $D_1$, $D_2$ and $D_3$ may be divided into two groups, where a first group includes the partial data $D_0$ and $D_1$ and a second group includes the partial data $D_2$ and $D_3$. Thus, by the above steps, column elements (for example, elements of the first column and the second column of the entire generator matrix) corresponding to the first group are set to non-zero, and at the same time column elements (for example, elements of the third column and the fourth column of the entire generator matrix) corresponding to the second group are set to zero. And the column elements (for example, elements of the first column and the second column of the entire generator matrix) corresponding to the first group are set to zero, and at the same time the column elements (for example, elements of the third column and the fourth column of the entire generator matrix) corresponding to the second group are set to non-zero. Thus, relevance of check blocks between the first group and the second group can be reduced, and partial recovery of the first group and the second group can be respectively implemented by using the above partial generator matrix $Q_3$. Similarly, when the group number G of the to-be-stored data is greater than 2, the relevance of check blocks between different groups may also be reduced based on the dividing principle of two groups. It may be understood that the specific process of dividing the rows of the entire generator matrix is not limited in examples of the present disclosure.

It is noted that the m=5 and k=4 in the above equations (1)-(7) are only application examples of the present disclosure. In fact, those skilled in the art may adopt other m and k values, for example, k=10 and m=4, as needed. It is understood that the specific number of the data blocks and check blocks is not limited in examples of the present disclosure.

To sum up, in a case that the entire check vector in the above step 102 includes elements associated with the partial data, the above elements are associated with the above partial data and irrelevant to the data other than the above partial data in the to-be-stored data. Thus, corresponding partial data may be recovered based on the above partial check vector without relying on other data.

In still another alternative example of the present disclosure, the partial data of the to-be-stored data may specifically include grouped partial data according to the to-be-stored data. The above partial check data may specifically include:

first partial check data corresponding to single-grouped partial data; and/or second partial check data corresponding to combined-grouped partial data.

A corresponding coding process may include:

at step A1, coding the single-grouped partial data to obtain corresponding first partial check data and/or at step A2, coding the combined-grouped partial data to obtain corresponding second partial check data.

In an example, the above to-be-stored data is grouped as needed. For example, when the group number is G, at step A1, the single-grouped partial data in the G groups is coded to obtain the corresponding first partial check. That is, the first partial check data may correspond to a single group. At step A2, the combined-grouped partial data in the G groups is coded to obtain the corresponding second partial check data. That is, the second partial check data may correspond to a combined group, where the number of the combined groups may be less than G.

After the partial check data is obtained by performing coding at step 102, the partial check data and its corresponding partial data may be stored at step 103. In an alternative example of the present disclosure, if the above partial data includes $k_1$ data blocks and the above partial check data includes $m_1$ check blocks, these data may be stored in $(k_1+m_1)$ different storage nodes dispersedly. The storage node is a logical abstraction of a storage device and may be a magnetic disk and may also be a storage server. That is, in examples of the present disclosure, the partial check data and its corresponding partial data may be stored dispersedly as single data block or single check block, to disperse the risk of data loss. Of course, the specific storage manner of the partial check data and its corresponding partial data is not limited in examples of the present disclosure.

In an alternative example of the present disclosure, to facilitate addressing of different partial check data, the method in examples of the present disclosure may further include:

storing a mapping relationship between single-grouped information and a memory address of the first partial check data; and/or storing a mapping relationship between combined-grouped information and a memory address of the second partial check data.

The above single-grouped information may be used to identify a single group, which may specifically include information, such as, identity (ID), name and so on of the single group. Similarly, the above combined-grouped information may also be used to indicate a combination of a plurality of groups. In an example, the above memory address may specifically include the storage path corresponding to the storage node. The corresponding partial check data may be accessed (including read) directly through the storage path.

In an alternative example of the present disclosure, the method may further include: generating entire check data corresponding to the entire data of the to-be-stored data; and storing the entire check data. In the alternative example, the entire check data may be stored based on the storage of the partial check data, so that the to-be-recovered data may be recovered based on the entire check data in a case that the partial data and the partial check data are insufficient to recover the to-be-recovered data.

To sum up, in examples of the present disclosure, the partial check data is obtained by performing coding based on the partial generator matrix corresponding to the partial data of the to-be-stored data. Since the rows of the above partial generator matrix may which are obtained by dividing include zero elements, it can be guaranteed that the above partial check data is associated with the above partial data and irrelevant to data other than the above partial data in the to-be-stored data. Thus, corresponding partial data may be recovered based on the above partial check data without relying on other data. That is, in examples of the present disclosure, it is possible to read only the partial check data and partial data corresponding to the to-be-recovered data during the data recovery. Therefore, read data volume during the data recovery can be reduced, thereby substantially reducing I/O consumption during data recovery.

Example of a Method of Recovery

Figure 2:
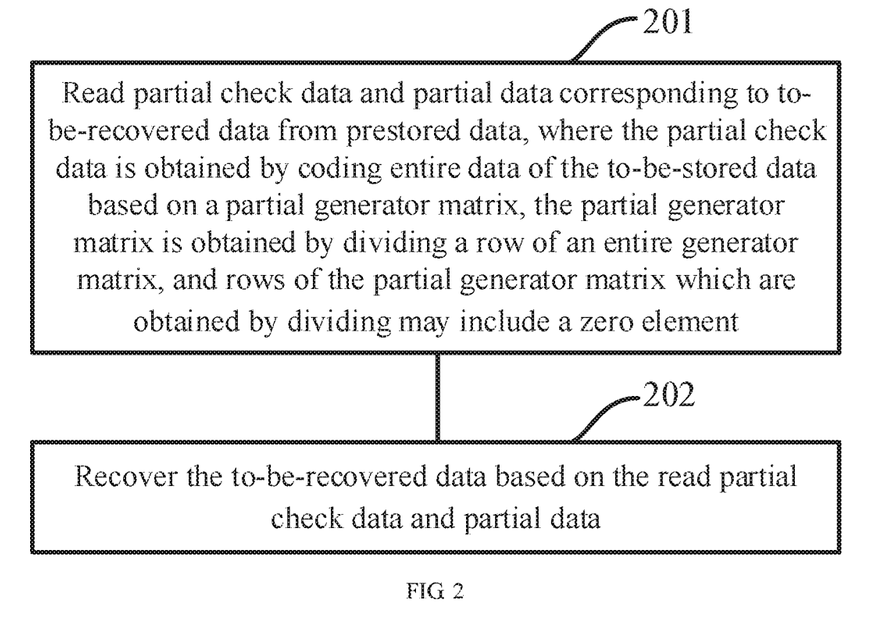
FIG. 2 is a flowchart illustrating steps of an example of a method of recovering data according to the present disclosure.

FIG. 2 illustrates steps of an example of a method of recovering data according to the present disclosure, which specifically includes the following steps 201 and 202.

At step 201, partial check data and partial data corresponding to to-be-recovered data are read from prestored data, where the partial check data is obtained by coding entire data of the to-be-stored data based on a partial generator matrix, the partial generator matrix is obtained by dividing a row of an entire generator matrix, and rows of the partial generator matrix which are obtained by dividing may include a zero element.

At step 202, the to-be-recovered data is recovered based on the read partial check data and partial data.

In an example of the present disclosure, the to-be-recovered data may be used to indicate data with the demands of recovery and usually correspond to invalid data blocks or invalid check blocks. In an example, the above to-be-recovered data may be indicated by an ID of a data block or a check block. For example, the to-be-recovered data may include a to-be-recovered data block $D_x$ that is numbered as X and/or a to-be-recovered check block $C_Y$ that is numbered as Y. The number of the above to-be-recovered data blocks or the to-be-recovered check blocks may be equal to or greater than 1. It may be understood that the specific to-be-recovered data is not limited in examples of the present disclosure.

In an alternative example of the present disclosure, the above partial data may also correspond to a group of data blocks of the entire data, that is, the partial data of the example of the present disclosure may include: at least one data block corresponding to the group. Further, the partial check data of the example of the present disclosure may also include at least one check block corresponding to the group. Reading solutions of reading the partial check data and partial data corresponding to the to-be-recovered data from the prestored data is provided below in examples of the present disclosure.

Reading Solution 1

In reading solution 1, the step 201 of reading the partial check data corresponding to the to-be-recovered data from the prestored data may specifically include the following sub-steps C1 and C2.

At sub-step C1, first to-be-recovered data belonging to a single target group is obtained from the to-be-recovered data.

At sub-step C2, when a data length of the first to-be-recovered data is not greater than a data length of first partial check data corresponding to the single target group, the first partial check data and the partial data corresponding to the single target group is read from the prestored data, as the partial check data and partial data corresponding to the first to-be-recovered data, where the first partial check data is obtained based on single-grouped partial data.

In reading solution 1, for the partial data of the single target group and its corresponding first partial check data, a maximum data length of the first to-be-recovered data is allowed to be equal to the data length of the first partial check data. For example, partial data of a single group includes $k_1$ data blocks, and first partial check data of the single group specifically includes $m_1$ check blocks. In a case that the data length of the data block is equal to the data length the check block, $m_1$ invalid blocks (including data blocks and check blocks) among the $(k_1+m_1)$ data blocks and check blocks corresponding to the single group can be recovered at most.

In an example, a mapping relationship between data block information or check block information and single-grouped information may be prestored, and thus at sub-step C1, the above mapping relationship may be queried based on information (for example, an identity) of the to-be-recovered data block or information of the to-be-recovered check block in the to-be-recovered data, to obtain a single target group to which the to-be-recovered data block or the to-be-recovered check block belongs, and extract the first to-be-recovered data belonging to the single target group from the to-be-recovered data. It may be understood that the specific process of obtaining the first to-be-recovered data belonging to the single target group from the to-be-recovered data in sub-step C1 is not limited in examples of the present disclosure.

In an alternative example of the present disclosure, when a comparison result shows that the data length of the first to-be-recovered data is less than or equal to the data length of the first partial check data corresponding to the single target group, it may be deemed that the partial data and the first partial check data of the single target group are suffi-cient to recover the first to-be-recovered data. Thus, the first partial check data and the partial data corresponding to the single target group may be read from the prestored data.

In an alternative example of the present disclosure, the step of reading the first partial check data corresponding to the single target group from the prestored data may specifically include the following sub-steps C21 and C22.

At sub-step C21, a first target memory address of the first partial check data corresponding to the single target group is obtained based on the prestored mapping relationship between the single-grouped information and the memory address of the first partial check data.

At sub-step C22, the corresponding first partial check data is read from the prestored data based on the first target memory address.

Similarly, a mapping relationship between the single-grouped information and the memory address of the partial data may also be prestored and the partial data corresponding to the above single target group is read based on the mapping relationship. It may be understood that the specific process of reading the partial data and the first partial check data corresponding to the single target group is not limited in examples of the present disclosure.

Reading Solution 2

In the reading solution 2, the step 201 of reading partial check data corresponding to the to-be-recovered data from the prestored data may specifically include the sub-steps D1, D2 and D3.

At sub-step D1, first to-be-recovered data belonging to a single target group is obtained from the to-be-recovered data.

At sub-step D2, when a data length of the first to-be-recovered data is greater than a data length of the first partial check data corresponding to the single target group, second to-be-recovered data belonging to a target combined group is obtained from the to-be-recovered data; the target combined group may specifically include the single target group.

At sub-step D3, when a data length of the second to-be-recovered data is not greater than a data length of second partial check data corresponding to the target combined group, the second partial check data and the partial data corresponding to the target combined group are read from the prestored data as the partial check data and partial data corresponding to the second to-be-recovered data, where the second partial check data may be obtained based on the partial data of the combined group.

In the reading solution 2, when the data length of the first to-be-recovered data is greater than the data length of the first partial check data corresponding to the single target group, for example, when the first to-be-recovered data includes three data blocks and the first partial check data includes two check blocks, it may be deemed that the partial data and the partial check data corresponding to the single target group are insufficient to recover the first to-be-recovered data. In this case, the second to-be-recovered data may be recovered based on the second partial check data and the partial data corresponding to the target combined group.

Relative to a case that the first to-be-recovered data corresponds to the single target group, the second to-be-recovered data may correspond to the target combined group. Specifically, the second to-be-recovered data may specifically include the first to-be-recovered data. The target combined group may specifically include the single target group, that is, the single target group is a subset of the target combined group. In an example of the present disclosure, G single groups are represented as $G_0, G_1, \ldots, G_{G-1}$ respectively, and a combined group may specifically include at least two of the above G single groups. It is assumed that the first to-be-recovered data includes three data blocks in the single group $G_0$ and the number of check blocks of the single group $G_0$ is two, target combined groups including $G_0$, for example, $\{G_0, G_1\}$, $\{G_0, G_2\}$, and $\{G_0, G_1, G_2\}$, may be obtained. It is noted that invalid blocks may exist or unexist in the single groups other than $G_0$ in the target combined groups, and thus the above second to-be-recovered data may be greater than the first to-be-recovered data, or may also be equal to the first to-be-recovered data.

For the partial data of the target combined group and its corresponding second partial check data, a maximum data length of the second to-be-recovered data is equal to a data length of the second partial check data. For example, if the partial data of the target combined group includes $(k_1+k_2)$ data blocks and the partial check data of the target combined group includes $(m_1+m_2)$ check blocks, in a case that the data length of data block is equal to the data length of check block, $(m_1+m_2)$ invalid blocks (including data blocks and check blocks) among the $(k_1+k_2+m_1+m_2)$ of data blocks and check blocks corresponding to the target combined group can be recovered at most.

In an example, a mapping relationship between the data block information or the check block information and the combined-grouped information may be prestored. Thus, at sub-step D2, the mapping relationship may be queried based on the information (e.g. identity) of the first to-be-recovered data, to obtain the target combined group to which the first to-be-recovered data belongs and extract the second to-be-recovered data belonging to the target combined group from the to-be-recovered data. It may be understood that the specific process of obtaining the second to-be-recovered data belonging to the target combined group from the to-be-recovered data in sub-step D2 is not limited in examples of the present disclosure. For example, a mapping relationship between the single-grouped information and the combined-grouped information may also be queried based on the information of the single target group to obtain the target combined group corresponding to the single target group.

In an alternative example of the present disclosure, when a comparison result shows that the data length of the second to-be-recovered data is less than or equal to the data length of the second partial check data corresponding to the target combined group, it may be deemed that the partial data and the second partial check data of the target combined group are sufficient to recover the second to-be-recovered data. Thus, the second partial check data and the partial data corresponding to the target combined group may be read from the prestored data.

In another alternative example of the present disclosure, the step of reading the second partial check data corresponding to the target combined group from the prestored data may specifically include the following sub-sub-steps D31 and D32.

At sub-sub-step D31, a second target memory address of the second partial check data corresponding to the target combined group is obtained based on the prestored mapping relationship between the combined-grouped information and the memory address of the second partial check data.

At sub-sub-step D32, the corresponding second partial check data is read from the prestored data based on the second target memory address.

Similarly, a mapping relationship between the target combined-grouped information and the memory address of the partial data may be prestored. The partial data corresponding to the above target combined group is read based on the mapping relationship. It may be understood that the specific process of reading the partial data and the second partial check data corresponding to the target combined group is not limited in examples of the present disclosure.

Through the reading solutions 1 and 2, the process of reading the partial check data and partial data corresponding to the to-be-recovered data from prestored data is detailed above. It may be understood that those skilled in the art may adopt any one or a combination of the above reading solution 1 and the above reading solution 2 as needed, or may adopt other reading solution. The specific process of reading the partial check data and partial data corresponding to the to-be-recovered data from prestored data is not limited in the present disclosure.

In an example, the to-be-recovered data may specifically include: a to-be-recovered data block and/or a to-be-recovered check block. When the to-be-recovered data only includes a to-be-recovered check block, the partial data may be re-coded to obtain the corresponding to-be-recovered check block. The recovery process of the to-be-recovered data block is mainly detailed in examples of the present disclosure.

In an alternative example of the present disclosure, if the read partial check data is obtained by coding the partial data independently, a corresponding recovery process may specifically include: constructing an entire decoding matrix; the entire decoding matrix may specifically include: a row of an entire generator matrix and a row of an identity matrix, where the row of the identity matrix does not include a row corresponding to the to-be-recovered data, the number of rows of the entire generator matrix is equal to the number of rows corresponding to the to-be-recovered data, and the entire decoding matrix is a square matrix; and decoding the partial check data and the partial data based on the entire decoding matrix to obtain raw data corresponding to the to-be-recovered data.

If the raw data of the partial data includes $k_1$ data blocks and the raw data of the partial check data includes $m_1$ check blocks, the corresponding identity matrix $I_1$ may be a $k_1 \times k_1$ square matrix. If one data block is invalid, a row corresponding to the invalid data block may be removed from the identity matrix $I_1$, where the removed row may correspond to the invalid data block. If the invalid data block is originally located at an i-th ($1 \leq i \leq k_1$) row of the identity matrix, the i-th row may also be removed from the identity matrix. It is noted that the removed i-th row may be compensated by a row of the entire generator matrix so that the above entire decoding matrix is a square matrix.

In an example of the present disclosure, if $k_1=4$, the entire generator matrix is the matrix P in the equation (1) and the invalid data block is the first data block $D_0$, the first row may be removed from the 4×4 identity matrix, and a row corresponding to a valid check block in the entire generator matrix is compensated. If the number of rows corresponding to the valid check blocks is greater than 1, any of those rows (such as, the first row) may be selected. Herein an entire decoding matrix corresponding to the above example is provided:

$$S = \begin{bmatrix} 0 & 1 & 0 & 0 \\ 0 & 0 & 1 & 0 \\ 0 & 0 & 0 & 1 \\ 1 & 1 & 1 & 1 \end{bmatrix} \quad (8)$$

In an alternative example of the present disclosure, the invalid data block $D_0$ may be decoded through the equation (9) based on the entire decoding matrix S, the partial data block $D_1$, $D_2$ and $D_3$, and the partial check block $C_0$:

$$\begin{bmatrix} 0 & 1 & 0 & 0 \\ 0 & 0 & 1 & 0 \\ 0 & 0 & 0 & 1 \\ 1 & 1 & 1 & 1 \end{bmatrix} * \begin{bmatrix} D_0 \\ D_1 \\ D_2 \\ D_3 \end{bmatrix} = \begin{bmatrix} D_1 \\ D_2 \\ D_3 \\ C_0 \end{bmatrix} \qquad (9)$$

Since the matrix S in the equation (9) is an invertible matrix, recovered raw data may be obtained by multiplying the inverse matrix $S'^{-1}$ of the matrix S by both sides of the equation (9):

$$\begin{bmatrix} D_0 \\ D_1 \\ D_2 \\ D_3 \end{bmatrix} = S'^{-1} * \begin{bmatrix} D_1 \\ D_2 \\ D_3 \\ C_0 \end{bmatrix} \qquad (10)$$

In another alternative example of the present disclosure, if the read partial check data is obtained by coding the entire data, the step 202 of recovering the to-be-recovered data based on the read partial check data and the partial data may include the sub-steps E1 and E2.

At sub-step E1, a partial decoding matrix is constructed; the partial decoding matrix may specifically include a row of the identity matrix and a row of the partial generator matrix. The rows of the identity matrix do not include a row corresponding to the to-be-recovered data and the partial decoding matrix may be a square matrix.

At sub-step E2, raw data corresponding to the to-be-recovered data is obtained by decoding the partial check data and the partial data based on the partial decoding matrix.

In an application example of the present disclosure, it is assumed that four data blocks $D_0$, $D_1$, $D_2$ and $D_3$ are divided into two groups, the first group includes $D_0$ and $D_1$ and the second group includes $D_2$ and $D_3$, and the entire data $D_0$, $D_1$, $D_2$ and $D_3$ is coded based on the partial generator matrix $Q_3$ of the equation (6). When $D_0$ is invalid, $D_0$ may be recovered based on the valid data block $D_1$ and the check block $C_0$. The corresponding partial decoding matrix T is expressed as:

$$T = \begin{bmatrix} 0 & 1 \\ 1 & 1 \end{bmatrix} \qquad (11)$$

In an alternative example of the present disclosure, the invalid data block $D_0$ may be decoded through the equation (11) based on the partial decoding matrix T, the partial data block $D_1$ and the partial check block $C_0$:

$$\begin{bmatrix} 0 & 1 \\ 1 & 1 \end{bmatrix} * \begin{bmatrix} D_0 \\ D_1 \end{bmatrix} = \begin{bmatrix} D_1 \\ C_0 \end{bmatrix} \qquad (12)$$

Since the matrix T in the equation (12) is an invertible matrix, recovered raw data may be obtained by multiplying the inverse matrix $T'^{-1}$ of the matrix T by both sides of the equation (12):

$$\begin{bmatrix} D_0 \\ D_1 \end{bmatrix} = T'^{-1} * \begin{bmatrix} D_1 \\ C_0 \end{bmatrix} \qquad (13)$$

In another application example of the present disclosure, when the partial data blocks $D_0$ and $D_1$ are invalid at the same time, $D_0$ and $D_1$ may be recovered based on the valid check blocks $C_0$ and $C_2$. The corresponding partial decoding matrix T may be expressed as:

$$T = \begin{bmatrix} 1 & 1 \\ 1 & 2 \end{bmatrix} \qquad (14)$$

It may be understood that those skilled in the art may perform recovery of the to-be-recovered data flexibly based on the sub-steps E1 and E2 as needed. The specific recovery process is not limited in examples of the present disclosure.

In an alternative example of the present disclosure, the method may further include: reading corresponding entire check data and entire data from prestored data when the data length of the second to-be-recovered data is greater than the data length of the second partial check data corresponding to the target combined group; recovering the to-be-recovered data based on the read entire check data and entire data. In a case that the partial data and the second partial check data are insufficient to recover the to-be-recovered data, the to-be-recovered data may be recovered based on the entire check data in the alternative example. Thus, reliability of data storage can be guaranteed.

Figure 3:
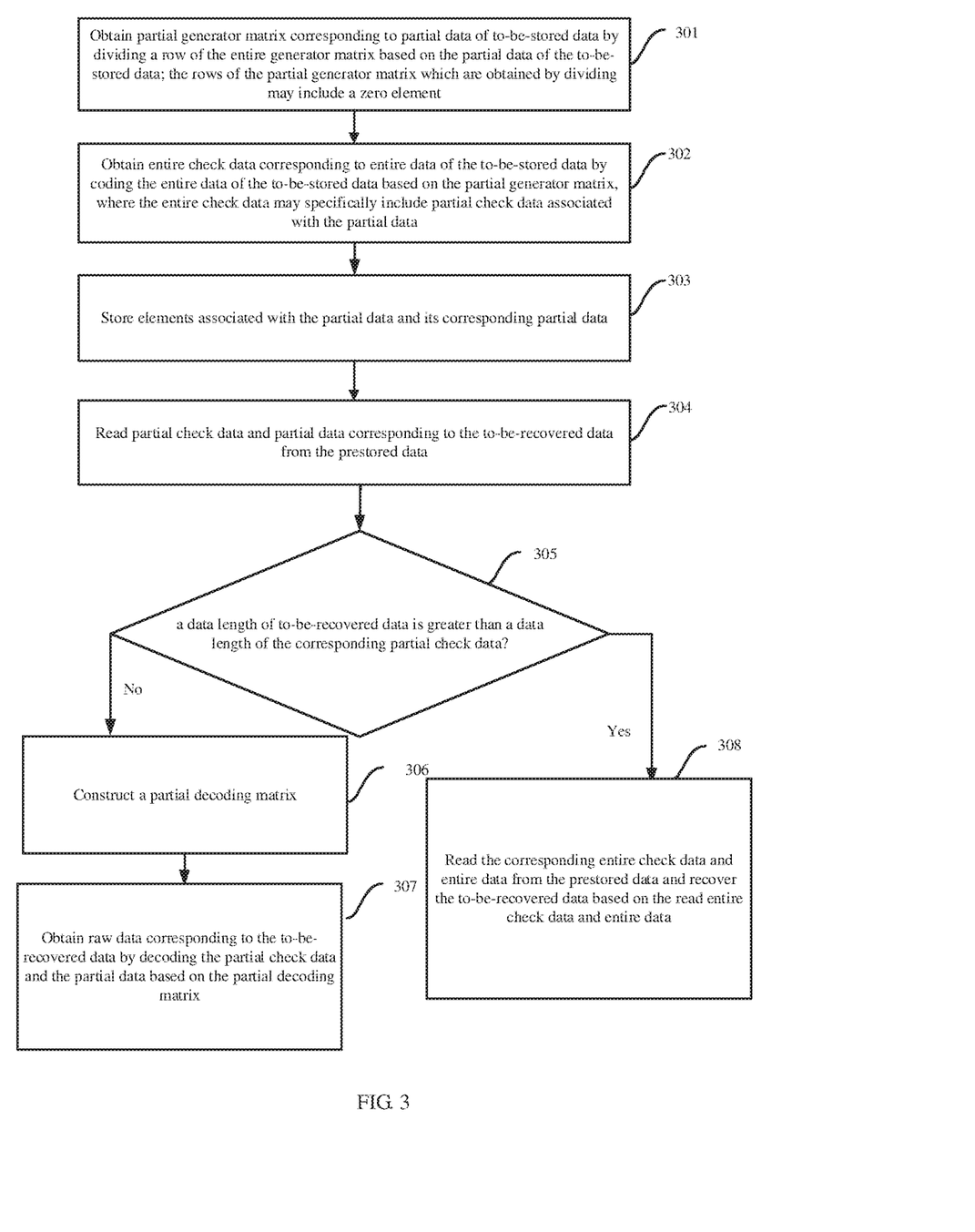
FIG. 3 is a flowchart illustrating steps of an example of a method of storing data and recovering data according to the present disclosure.

To help those skilled in the art to better understand the examples of the present disclosure, FIG. 3 illustrates a flowchart of steps of an example of a method of storing and recovering data according to the present disclosure, which specifically includes the following steps 301-308.

At step 301, partial generator matrix corresponding to partial data of to-be-stored data is obtained by dividing a row of the entire generator matrix based on the partial data of the to-be-stored data; the rows of the partial generator matrix which are obtained by dividing may include a zero element.

At step 302, entire check data corresponding to entire data of the to-be-stored data is obtained by coding the entire data of the to-be-stored data based on the partial generator matrix, where the entire check data may specifically include partial check data associated with the partial data.

At step 303, elements associated with the partial data and its corresponding partial data are stored.

At step 304, partial check data and partial data corresponding to the to-be-recovered data are read from the prestored data.

At step 305, it is determined whether a data length of to-be-recovered data is greater than a data length of the corresponding partial check data. If no, the step 306 is performed and if yes, the step 309 is performed.

At step 306, a partial decoding matrix is constructed. The partial decoding matrix may specifically include at least one of the identity matrix without a row corresponding to the to-be-recovered data and the partial generator matrix, and the partial decoding matrix is a square matrix.

At step 307, raw data corresponding to the to-be-recovered data is obtained by decoding the partial check data and the partial data based on the partial decoding matrix.

At step 308, the corresponding entire check data and entire data are read from the prestored data and the to-be-recovered data is recovered based on the read entire check data and entire data.

It is noted that step 304 may implement the read of the partial check data and the partial data by using any one or a combination of the reading solution 1 and the reading solution 2, and step 306 may implement data recovery based on sub-steps E1 and E2, and the recovery process of step 308 may be referred to the recovery process of obtaining the partial check data by coding the partial data independently as above, which is not repeated herein.

It is noted that, for simplicity of description, the method examples are expressed as a combination of a series of actions. However, those skilled in the art shall know that the examples of the present disclosure are not limited by a sequence of the described actions because some steps may be adopted in another sequence or simultaneously based on the example of the present disclosure. Next, those skilled in the art also should know that the examples described in the specification are all preferred examples and the actions involved are not necessarily required by the examples of the present disclosure.

Example of Storage Apparatus

Figure 4:
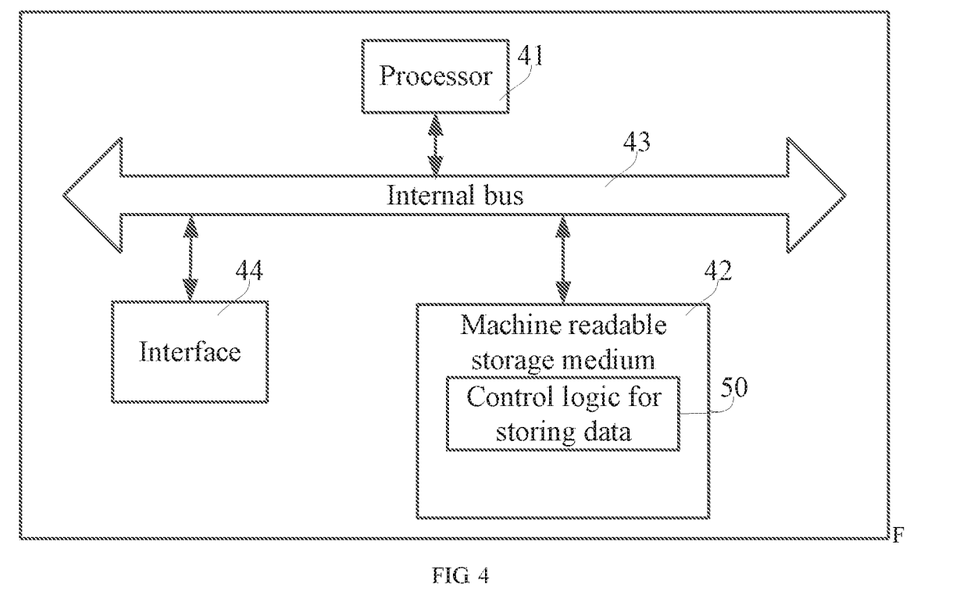
FIG. 4 is a schematic diagram illustrating a hardware structure of an apparatus for storing data according to an example of present disclosure.

FIG. 4 is a schematic diagram illustrating a hardware structure of an apparatus for storing data according to an example of the present disclosure. The apparatus for storing data may include a processor 41 and a machine readable storage medium 42. The processor 41 and the machine readable storage medium 42 are usually connected with each other via an internal bus 43. In other possible implementations, the apparatus for storing data may further include an external interface 44 to communicate with other devices or components.

In different examples, the machine readable storage medium 42 may include: a Random Access Memory (RAM), a volatile memory, a nonvolatile memory, a flash memory, a storage drive (e.g. hard disk drive), a solid state hard disk, any type of storage disk (e.g., optical disk, Digital Video Disk (DVD)), or a similar storage medium, or a combination thereof.

Figure 5:
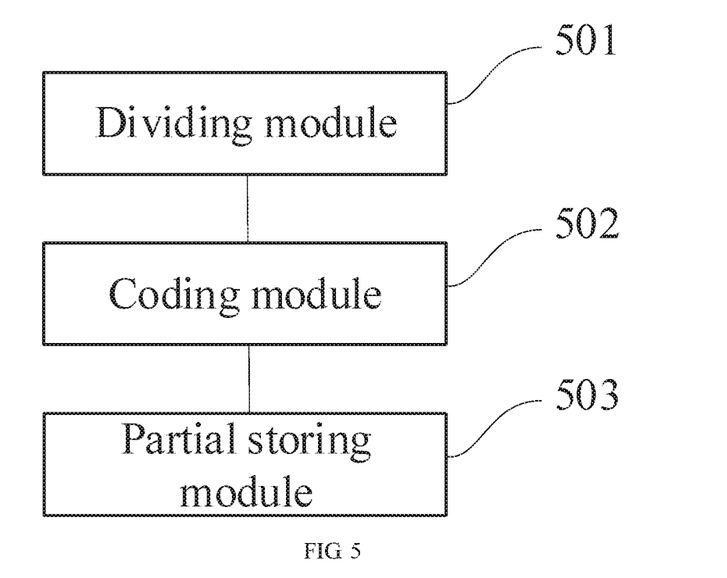
FIG. 5 is a schematic diagram illustrating functional modules of control logic for storing data according to an example of the present disclosure.

Further, the machine readable instructions corresponding to the control logic 50 for storing data executed by the processor 41 can be stored on the machine readable storage medium 42. In this case, when the processor 41 reads and executes the machine readable instructions stored on the machine readable storage medium 42, the processor 41 can execute the above method of storing data. Divided by functions, as shown in FIG. 5, the control logic 50 for storing data may include dividing module 501, coding module 502 and partial storing module 503.

Dividing module 501 is configured to obtain a partial generator matrix corresponding to partial data of to-be-stored data by dividing a row of an entire generator matrix based on the partial data of to-be-stored data. The rows of the partial generator matrix which are obtained by dividing may include a zero element.

Coding module 502 is configured to generate entire check data corresponding to entire data of the to-be-stored data by coding the entire data of the to-be-stored data based on the partial generator matrix. The entire check data may specifically include: partial check data associated with the partial data.

Partial storing module 503 is configured to store the partial check data and partial data corresponding to the partial check data.

In an alternative example of the present disclosure, the control logic 50 for storing data may further include: obtaining module configured to obtain the partial data of the to-be-stored data.

The obtaining module may further include:
  dividing sub-module, configured to divide the to-be-stored data into data blocks; and
  grouping sub-module, configured to group the data blocks and obtain the partial data according to each of the groups.

In another alternative example of the present disclosure, the partial data of the to-be-stored data may specifically include grouped partial data based on the to-be-stored data, the partial check data may specifically include:
  first partial check data corresponding to single-grouped partial data; and/or
  second partial check data corresponding to combined-grouped partial data.

In another alternative example of the present disclosure, the control logic 50 for storing data may further include:
  first relationship storing module, configured to store a mapping relationship between single-grouped information and a memory address of the first partial check data; and/or
  second relationship storing module, configured to store a mapping relationship between combined-grouped information and a memory address of the second partial check data.

In another alternative example of the present disclosure, the control logic 50 for storing data may further include:
  entire checking generator module, configured to generate the entire check data corresponding to the entire data of the to-be-stored data:
  entire storing module, configured to store the entire check data.

The following is an example of software implementation which further explains how the apparatus for storing data to execute the control logic 50. In the example, the control logic in present disclosure may be understood as machine readable instructions stored on machine readable storage medium 42. When the processor 41 on the apparatus for storing data of the present disclosure executes the control logic, by invoking the machine readable instructions stored on the machine readable storage medium 42, the processor 41 is configured to execute the following operations:
  obtaining a partial generator matrix corresponding to partial data of to-be-stored data by dividing a row of an entire generator matrix based on the partial data of to-be-stored data; where the rows of the partial generator matrix which are obtained by dividing include a zero element;
  generating entire check data corresponding to entire data of the to-be-stored data by coding the entire data of the to-be-stored data based on the partial generator matrix, where the entire check data includes partial check data associated with the partial data; and
  storing the partial check data and partial data corresponding to the partial check data.

In the example, when obtaining the partial data of the to-be-stored data, the machine readable instructions stored on the machine readable storage medium 42 cause the processor 41 to:
  divide the to-be-stored data into data blocks;
  group the data blocks;
  obtain the partial data according to each of the groups.

In the example, the partial data of the to-be-stored data may include grouped partial data based on the to-be-stored data.

In the example, the partial check data may include:
first partial check data corresponding to single-grouped partial data; and/or
second partial check data corresponding to combined-grouped partial data.

In the example, the machine readable instructions stored on machine readable storage medium 42 further cause the processor 41 to:
store a mapping relationship between single-grouped information and a memory address of the first partial check data; and/or
store a mapping relationship between combined-grouped information and a memory address of the second partial check data.

Since the examples of the apparatus for storing data are substantially similar to the examples of the method for storing data, simple descriptions are made here and relevant part may be referred to partial descriptions of the examples of the method of storing data.

Example of Recovery Apparatus

Figure 6:
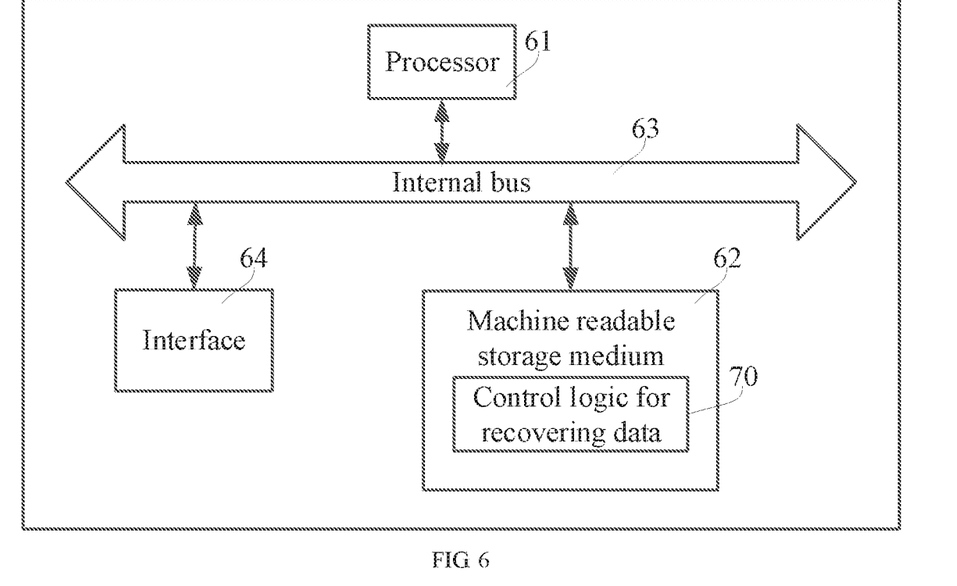
FIG. 6 is a schematic diagram illustrating a hardware structure of an apparatus for recovering data according to an example of the present disclosure.

FIG. 6 is a schematic diagram illustrating a hardware structure of an apparatus for recovering data according to an example of the present disclosure. The apparatus for recovering data may include a processor 61 and a machine readable storage medium 62. The processor 61 and the machine readable storage medium 62 are usually connected with each other via an internal bus 63. In other possible implementations, the apparatus for recovering data may also include an external interface 64 to communicate with other devices or components.

In different examples, the machine readable storage medium 62 may be: a RAM (Random Access Memory), a volatile memory, a nonvolatile memory, a flash memory, a storage drive (e.g. hard disk drive), a solid state hard disk, any type of storage disk (e.g., optical disk, Digital Video Disk (DVD)), or a similar storage medium, or a combination thereof.

Figure 7:
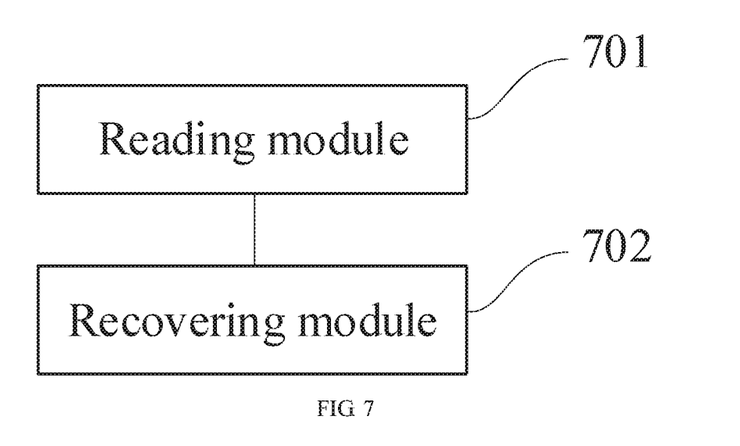
FIG. 7 is a schematic diagram illustrating functional modules of control logic for recovering data according to an example of the present disclosure.

Further, the machine readable instructions corresponding to the control logic 70 for recovering data executed by the processor 61 can be stored on storage medium 62. In this case, when the processor 61 reads and executes the machine readable instructions stored on the machine readable storage medium 62, the processor 61 can execute the above method of recovering data. Divided by functions, as shown in FIG. 7, the control logic 70 for recovering data may include reading module 701 and recovering module 702.

Reading module 701 may be configured to read partial check data and partial data corresponding to to-be-recovered data from prestored data for to-be-recovered data, where the partial check data is obtained by coding entire data of the to-be-stored data based on a partial generator matrix, the partial generator matrix is obtained by dividing a row of an entire generator matrix, and rows of the partial generator matrix which are obtained by dividing include a zero element.

Recovering module 702 may be configured to recover the to-be-recovered data based on the read partial check data and partial data.

In a summary of an alternative example of the present disclosure, the recovering module 702 may specifically include:

constructing sub-module, configured to construct partial decoding matrix; the partial decoding matrix may specifically include: a row of an identity matrix and a row of the partial generator matrix, the row of the identity matrix does not include a row corresponding to the to-be-recovered data and the partial decoding matrix is a square matrix; and
decoding sub-module, configured to obtain raw data corresponding to the to-be-recovered data by decoding the partial check data and partial data based on the partial decoding matrix.

In an alternative example of the present disclosure, the reading module 701 may specifically include:
first obtaining sub-module, configured to obtain first to-be-recovered data belonging to a single target group from the to-be-recovered data; and
first reading sub-module, configured to when a data length of the first to-be-recovered data is not greater than a data length of first partial check data corresponding to the single target group, read first partial check data and partial data corresponding to the single target group from the prestored data, as partial check data and partial data corresponding to the first to-be-recovered data; where the first partial check data is obtained based on single-grouped partial data.

In an alternative example of the present disclosure, the first reading sub-module may specifically include:
first address obtaining unit, configured to obtain a first target memory address of the first partial check data corresponding to the single target group based on a prestored mapping relationship between single-grouped information and a memory address of the first partial check data;
first reading unit, configured to read the first partial check data from the prestored data based on the first target memory address.

In an alternative example of the present disclosure, the reading module 701 may specifically include:
first obtaining sub-module, configured to obtain first to-be-recovered data belonging to a single target group from the to-be-recovered data;
second obtaining sub-module, configured to when a data length of the first to-be-recovered data is greater than a data length of first partial check data corresponding to the single target group, obtain second to-be-recovered data belonging to a target combined group from the to-be-recovered data, where the target combined group includes the single target group; second reading sub-module, configured to when a data length of the second to-be-recovered data is not greater than a data length of second partial check data corresponding to the target combined group, read the second partial check data and partial data corresponding to the target combined group from the prestored data, as partial check data and partial data corresponding to the second to-be-recovered data, where the second partial check data is obtained based on combined-grouped partial data.

In an alternative example of the present disclosure, the second reading sub-module may specifically include:
second address obtaining unit, configured to obtain a second target memory address of the second partial check data corresponding to the target combined group based on a prestored mapping relationship between combined-grouped information and a memory address of the second partial check data;

first reading unit, configured to read the second partial check data from the prestored data based on the second target memory address.

In an alternative example of the present disclosure, the control logic 70 for recovering data may further include:
  entire reading module, configured to read the corresponding entire check data and entire data from prestored data when the data length of the second to-be-recovered data is greater than the data length of the second partial check data corresponding to the target combined group; and
  entire recovering module, configured to recover the to-be-recovered data based on the read entire check data and the entire data.

The following is an example of software implementation which further explains how an apparatus for recovering data to execute the control logic 70. In the example, the control logic in present disclosure may be understood as machine readable instructions stored on machine readable storage medium 62. When the processor 61 on the apparatus for recovering data of the present disclosure executes the control logic, by invoking the machine readable instructions stored on the machine readable storage medium 62, the processor 61 executes the following operations:
  reading partial check data and partial data corresponding to to-be-recovered data from prestored data, where the partial check data is obtained by coding entire data of the to-be-stored data based on a partial generator matrix, the partial generator matrix is obtained by dividing a row of an entire generator matrix, and rows of the partial generator matrix which are obtained by dividing include a zero element;
  recovering the to-be-recovered data based on the read partial check data and partial data.

In the example, when recovering the to-be-recovered data based on the read partial check data and partial data, the machine readable instructions cause the processor to:
  construct a partial decoding matrix, where the partial decoding matrix includes: a row of an identity matrix and a row of the partial generator matrix, the row of the identity matrix does not include a row corresponding to the to-be-recovered data and the partial decoding matrix is a square matrix; and
  obtain raw data corresponding to the to-be-recovered data by decoding the partial check data and partial data based on the partial decoding matrix.

In the example, when reading the partial check data corresponding to the to-be-recovered data from the prestored data, the machine readable instructions cause the processor to:
  obtain first to-be-recovered data belonging to a single target group from the to-be-recovered data;
  when a data length of the first to-be-recovered data is not greater than a data length of first partial check data corresponding to the single target group, read first partial check data and partial data corresponding to the single target group from the prestored data, as partial check data and partial data corresponding to the first to-be-recovered data, where the first partial check data is obtained based on single-grouped partial data.

In the example, when reading the first partial check data corresponding to the single target group from the prestored data, the machine readable instructions cause the processor to:
  obtain a first target memory address of the first partial check data corresponding to the single target group based on a prestored mapping relationship between single-grouped information and a memory address of the first partial check data and
  read the first partial check data from the prestored data based on the first target memory address.

In the example, when reading the partial check data corresponding to the to-be-recovered data from the prestored data, the machine readable instructions cause the processor to:
  obtain first to-be-recovered data belonging to a single target group from the to-be-recovered data;
  when a data length of the first to-be-recovered data is greater than a data length of first partial check data corresponding to the single target group, obtain second to-be-recovered data belonging to a target combined group from the to-be-recovered data, where the target combined group comprises the single target group;
  when a data length of the second to-be-recovered data is not greater than a data length of second partial check data corresponding to the target combined group, read the second partial check data and partial data corresponding to the target combined group from the prestored data, as partial check data and partial data corresponding to the second to-be-recovered data, where the second partial check data is obtained based on combined-grouped partial data.

In the example, when reading the second partial check data corresponding to the target combined group from the prestored data, the machine readable instructions cause the processor to:
  obtain a second target memory address of the second partial check data corresponding to the target combined group based on a prestored mapping relationship between combined-grouped information and a memory address of the second partial check data;
  read the second partial check data from the prestored data based on the second target memory address.

Since the examples of the apparatus are basically similar to the examples of the method, simple descriptions are made here and relevant part may be referred to partial descriptions of the examples of the method.

Each example of the specification is described in a progressive manner and each example stresses the differences from other examples. The same or similar parts between different examples may be referred to each other.

Those skilled in the art should understand that methods, apparatuses, or computer program products may be provided by examples of the present disclosure. Thus, entire hardware examples, entire software examples or examples combining software and hardware may be adopted in the present disclosure. Further, examples of the present disclosure may use the form of a computer program product that is operated on one or more computer available storage medium (including but not limited to magnetic disk memory, CD-ROM, and optical memory and so on) including computer available program codes.

In a typical configuration, the computer device may include one or more central processing units (CPU), an input/output interface, a network interface and a memory. The memory may include a non-permanent memory, a random access memory (RAM) and/or a nonvolatile memory and so on in a computer readable storage medium, such as Read Only Memory (ROM), or Flash RAM. The memory is an example of the computer readable storage medium. The computer readable medium includes a permanent type and a non-permanent type, mobile and non-mobile medium. Information storage may be implemented by any method or technology. The information may be computer readable instructions, data structure, program modules or other data. The examples of the computer storage medium include but not limited to phase change random access memory (PRAM), Static Random Access Memory (SRAM), Dynamic Random Access Memory (DRAM), other types of RAMs, ROM, Electrically Erasable Programmable Read-Only Memory (EEPROM), flash memory, or other memory technologies, Compact Disc Read-Only Memory (CDROM), Digital Versatile Disc (DVD), or other optical storages, cassette magnetic tapes, magnetic tape and magnetic disc storage or other magnetic storage devices or other non-transmission medium, which may be used to store information accessible by a computer device. According to the definition in the text, the computer readable medium does not include transitory computer readable media such as modulated data signals and carrier waves.

Examples of the present disclosure are described by referring to flowcharts and/or block diagrams of a method, a terminal device (a system) and a computer program product in examples of the present disclosure. It is understood that each flowchart and/or block in the flowcharts and/or the block diagrams or a combination of a flow chart and/or a block of the flowcharts and/or the block diagrams may be implemented by computer program instructions. These computer program instructions may be provided to a general-purpose computer, a dedicated computer, an embedded processor, or a processor of another programmable data processing device to generate a machine, so that the instructions executed by a computer or a processor of another programmable data processing device generate an apparatus for implementing functions designated in one or more flows of the flowcharts and/or one or more blocks of the block diagrams.

Further, these computer program instructions may also be stored in a computer readable memory that can direct a computer or another programmable data processing device to work in a particular manner, so that the instructions stored in the computer readable memory generate a product including an instruction apparatus and the instruction apparatus can implement functions designated in one or more flows of the flowcharts and/or one or more blocks of the block diagrams.

The computer program instructions may also be loaded on a computer or another programmable data processing devices, so that a series of operation steps can be executed on the computer or another programmable device to generate processing implemented by the computer, and thus instructions executable on the computer or another programmable device are provided for steps for realizing functions designated in one or more flows of the flowcharts and/or one or more blocks of the block diagrams.

Although the preferred examples of the present disclosure are already described, those skilled in the art may make additional changes or modifications to the examples once knowing the basic creative concepts. Thus, the appended claims are intended to include the preferred examples and all changes and modifications that all fall within the protection scope of the examples of the present disclosure.

It shall be noted that the relational terms such as "first" and "second" used herein are merely intended to distinguish one entity or operation from another entity or operation rather than to require or imply any such actual relation or order existing between these entities or operations. Also, the term "including", "containing" or any variation thereof is intended to encompass non-exclusive inclusion, so that a process, method, article or device including a series of elements includes not only those elements but also other elements not listed explicitly or those elements inherent to such a process, method, article or device. Without more limitations, an element defined by the statement "including a . . . " shall not be precluded to include additional same elements present in a process, method, article or device including the elements.

The above are detailed descriptions of a method and an apparatus for storing data and a method and an apparatus for recovering data provided according to the examples of the present disclosure. Specific examples are used herein to set forth the principles and the implementing methods of the present disclosure, and the descriptions of the above examples are only meant to help understanding of the method and the core idea of the present disclosure. Meanwhile, those of ordinary skill in the art may make alterations to the specific examples and the scope of application in accordance with the idea of the present disclosure. In conclusion, the contents of the present specification shall not be interpreted as limiting to the present disclosure.

The invention claimed is:

1. A method of storing data, comprising:
   dividing to-be-stored data into k data blocks, wherein k is an integer greater than 1;
   forming a first matrix of k rows and 1 column with the k data blocks;
   grouping the k data blocks into a plurality of groups;
   obtaining a partial generator matrix by dividing, based on the plurality of groups, a row of an entire generator matrix into R rows, R being an integer greater than 1, the entire generator matrix being a matrix of m rows and k columns, m being an integer greater than 1, the partial generator matrix being a matrix of m+R−1 rows and k columns, wherein rows of the partial generator matrix which are obtained by dividing comprise a zero element, an element which is in a divided row of the partial generator matrix and corresponds to one of the plurality of groups is non-zero, an element which is in the divided row of the partial generator matrix and corresponds to other groups of the plurality of groups is zero;
   generating entire check data by multiplying the partial generator matrix by the first matrix, wherein the entire check data comprises partial check data associated with the plurality of groups; and
   storing the plurality of groups and the partial check data associated with the plurality of groups.

2. The method according to claim 1, further comprises:
   storing a mapping relationship between group information and a memory address of the partial check data, wherein the group information is configured to identify the plurality of groups.

3. A method of recovering data, comprising:
   reading partial check data and partial data corresponding to to-be-recovered data from prestored data, wherein
      the partial check data is obtained by multiplying a partial generator matrix by a first matrix corresponding to the partial, the first matrix is a matrix of k rows and 1 column and formed by k data blocks, the partial data is a part of the first matrix, the k data blocks is grouped into a plurality of groups, k is an integer greater than 1,
      the partial generator matrix is obtained by dividing a row of an entire generator matrix into R rows, R is an integer greater than 1, the entire generator matrix is a matrix of m rows and k columns, m is an integer greater than 1, the partial generator matrix is a matrix of m+R−1 rows and k columns, and rows of the partial generator matrix which are obtained by dividing comprise a zero element, an element which is in a divided row of the partial generator matrix and corresponds to one of the plurality of groups is non-zero, an element which is in the divided row of the partial generator matrix and corresponds to other groups of the plurality of groups is zero; and recovering the to-be-recovered data based on the read partial check data and partial data.

4. The method according to claim 3, wherein recovering the to-be-recovered data based on the read partial check data and partial data comprises:

constructing a partial decoding matrix, wherein
the partial decoding matrix comprises: a row of an identity matrix and non-zero elements in a row of the partial generator matrix corresponding to the to-be-recovered data,
the row of the identity matrix comprised in the partial decoding matrix is not a row of the identity matrix corresponding to the to-be-recovered data, and
the partial decoding matrix is a square matrix; and
recovering the to-be-recovered data by decoding the partial check data and partial data based on the partial decoding matrix.

5. The method according to claim 3, wherein reading the partial check data corresponding to the to-be-recovered data from the prestored data comprises:

obtaining first to-be-recovered data belonging to a single group from the to-be-recovered data;

when a data length of the first to-be-recovered data is greater than a data length of first partial check data corresponding to the single group, obtaining second to-be-recovered data belonging to a combined group from the to-be-recovered data, wherein the combined group comprises the single group; and when a data length of the second to-be-recovered data is not greater than a data length of second partial check data corresponding to the combined group, reading the second partial check data and partial data corresponding to the combined group from the prestored data, as partial check data and partial data corresponding to the second to-be-recovered data, wherein the second partial check data is obtained based on combined-grouped partial data.

6. The method according to claim 5, wherein reading the second partial check data corresponding to the combined group from the prestored data comprises:

obtaining a second memory address of the second partial check data corresponding to the combined group based on a prestored mapping relationship between combined-grouped information and the second memory address of the second partial check data; and reading the second partial check data from the prestored data based on the second memory address.

7. An apparatus for recovering data, comprises:
a processor,
by reading machine readable instructions corresponding to control logic for recovering data stored on a storage medium, the processor is configured to execute the method of recovering data in claim 3.

8. The apparatus according to claim 7, wherein when recovering the to-be-recovered data based on the read partial check data and partial data, the machine readable instructions cause the processor to:

construct a partial decoding matrix, wherein
the partial decoding matrix comprises: a row of an identity matrix and non-zero elements in a row of the partial generator matrix corresponding to the to-be-recovered data,
the row of the identity matrix comprised in the partial decoding matrix is not row of the identity matrix corresponding to the to-be-recovered data, and
the partial decoding matrix is a square matrix; and
recover the to-be-recovered data by decoding the partial check data and partial data based on the partial decoding matrix.

9. The apparatus according to claim 7, wherein when reading the partial check data corresponding to the to-be-recovered data from the prestored data, the machine readable instructions cause the processor to:

obtain first to-be-recovered data belonging to a single group from the to-be-recovered data;

when a data length of the first to-be-recovered data is greater than a data length of first partial check data corresponding to the single group, obtain second to-be-recovered data belonging to a combined group from the to-be-recovered data, wherein the combined group comprises the single group; and when a data length of the second to-be-recovered data is not greater than a data length of second partial check data corresponding to the combined group, read the second partial check data and partial data corresponding to the combined group from the prestored data, as partial check data and partial data corresponding to the second to-be-recovered data, wherein the second partial check data is obtained based on combined-grouped partial data.

10. The apparatus according to claim 9, wherein the machine readable instructions further cause the processor to:

when the data length of the second to-be-recovered data is greater than the data length of the second partial check data corresponding to the combined group, reading the entire data and entire check data from the prestored data; and recovering the to-be-recovered data based on the read entire check data and the entire data.

* * * * *